United States Patent
Sugai et al.

(10) Patent No.: US 10,549,532 B2
(45) Date of Patent: Feb. 4, 2020

(54) LIQUID EJECTING APPARATUS

(71) Applicant: Seiko Epson Corporation, Tokyo (JP)

(72) Inventors: Keigo Sugai, Chino (JP); Takahiro Katakura, Okaya (JP); Hirofumi Sakai, Shiojiri (JP); Shinichi Nakamura, Okaya (JP); Junichi Sano, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/919,595

(22) Filed: Mar. 13, 2018

(65) Prior Publication Data
US 2018/0281409 A1 Oct. 4, 2018

(30) Foreign Application Priority Data
Mar. 28, 2017 (JP) .................. 2017-062698

(51) Int. Cl.
B41J 2/14 (2006.01)
B41J 2/045 (2006.01)
H01L 41/09 (2006.01)

(52) U.S. Cl.
CPC .......... *B41J 2/14233* (2013.01); *B41J 2/045* (2013.01); *H01L 41/0973* (2013.01)

(58) Field of Classification Search
CPC .... B41J 2/14233; B41J 2/045; B41J 2202/12; B41J 2202/05; H01L 41/0973
See application file for complete search history.

(56) References Cited

U.S. PATENT DOCUMENTS

2007/0279460 A1 12/2007 Yokoyama et al.
2011/0228012 A1 9/2011 Yoshida et al.
(Continued)

FOREIGN PATENT DOCUMENTS

| CN | 101081562 A | 12/2007 |
|---|---|---|
| EP | 1862311 A1 | 12/2007 |
| GB | 2520745 A | 6/2015 |

(Continued)

OTHER PUBLICATIONS

Extended European Search Report for Patent Application No. EP18162073.3, dated Sep. 5, 2018 (10 pages).

*Primary Examiner* — Geoffrey S Mruk
(74) *Attorney, Agent, or Firm* — Harness, Dickey & Pierce, P.L.C.

(57) ABSTRACT

A liquid ejecting apparatus including; a first liquid chamber that communicates with a first nozzle, a first channel, and a first outflow channel; a second liquid chamber that communicates with a second nozzle, a second channel, and a second outflow channel; a first volume changing portion that changes a volume of the first liquid chamber to eject liquid from the first nozzle; a second volume changing portion that changes a volume of the second liquid chamber to eject the liquid from the second nozzle; a first inflow channel resistance changing portion that changes a flow channel resistance of the first inflow channel, a second inflow channel resistance changing portion that changes a flow channel resistance of the second inflow channel, and an inflow channel-side common drive portion that applies drive forces to the first inflow channel resistance changing portion and the second inflow channel resistance changing portion.

4 Claims, 10 Drawing Sheets

(56) References Cited

U.S. PATENT DOCUMENTS

2011/0234706 A1 9/2011 Yoshida et al.
2014/0078224 A1 3/2014 Park et al.

FOREIGN PATENT DOCUMENTS

| JP | 06-134990 A | 5/1994 | |
|----|----|----|----|
| JP | 2001-063047 A | 3/2001 | |
| JP | 2009-160732 A | 7/2009 | |
| JP | 2011-213094 A | 10/2011 | |
| JP | 2011-224971 A | 11/2011 | |
| WO | WO 2016/042878 A1 * | 3/2016 | ................ B41J 2/01 |
| WO | WO-2016-042878 A1 | 3/2016 | |

* cited by examiner

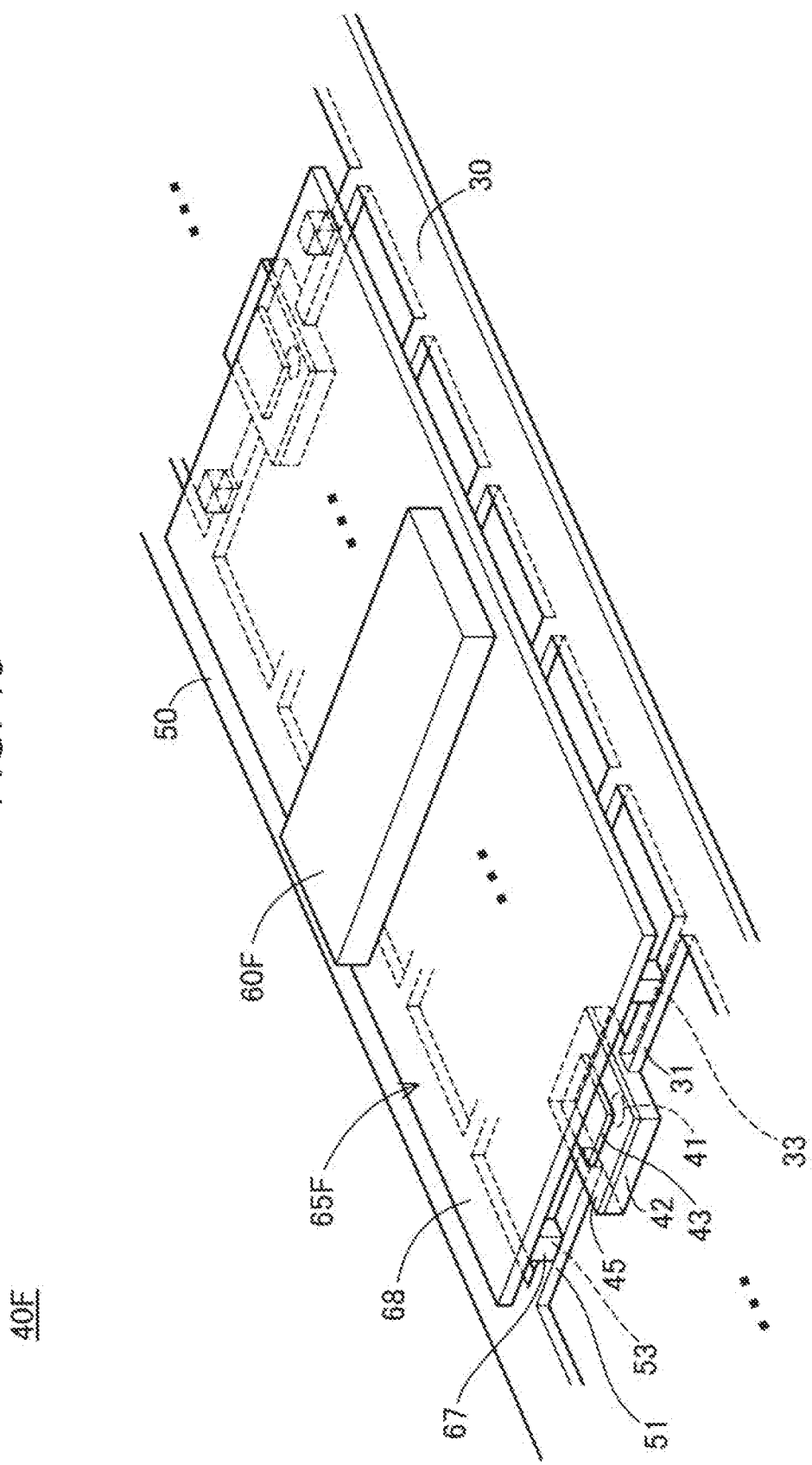

LIQUID EJECTING APPARATUS

BACKGROUND

1. Technical Field

The present invention relates to a liquid ejecting apparatus.

2. Related Art

There have been proposed various liquid ejecting apparatuses that eject liquid in a liquid chamber from a nozzle communicating with the liquid chamber by changing the volume of the liquid chamber. In order to suppress a long period of stagnation of the liquid in the liquid chamber, this type of liquid ejecting apparatus may have an outflow channel through which the liquid is discharged from the liquid chamber in addition to an inflow channel through which the liquid is supplied to the liquid chamber (for example, JP-A-2011-213094).

In the liquid ejecting apparatus having the inflow channel and the outflow channel, it is desirable that the flow rates of the liquid in the inflow channel and the outflow channel can be controlled appropriately in order to eject the liquid from the nozzle satisfactorily and also suppress leakage of the liquid from the nozzle. When actuators that control the flow rates of the liquid in the inflow channel and the outflow channel are provided in addition to an actuator that ejects the liquid from the nozzle, however, the size of the liquid ejecting apparatus may increase. When a head having a plurality of nozzles is provided with those actuators for the respective liquid chambers of the nozzles, it may be difficult to array the plurality of nozzles at a high density by reducing the distance between the nozzles. Those problems are common to general liquid ejecting apparatuses capable of ejecting liquid.

SUMMARY

Advantages of some aspects of the invention are as follows.

[1] According to a first aspect of the invention, there is provided a liquid ejecting apparatus that ejects liquid from a plurality of nozzles including at least a first nozzle and a second nozzle. The liquid ejecting apparatus includes: a first liquid chamber that communicates with the first nozzle; a second liquid chamber that communicates with the second nozzle; a first volume changing portion that changes a volume of the first liquid chamber to eject the liquid from the first nozzle; a second volume changing portion that changes a volume of the second liquid chamber to eject the liquid from the second nozzle; a first inflow channel which is connected to the first liquid chamber and through which the liquid flows into the first liquid chamber; a second inflow channel which is connected to the second liquid chamber and through which the liquid flows into the second liquid chamber; a first outflow channel which is connected to the first liquid chamber and through which the liquid flows out of the first liquid chamber; a second outflow channel which is connected to the second liquid chamber and through which the liquid flows out of the second liquid chamber; a first inflow channel resistance changing portion that changes a flow channel resistance of the first inflow channel; a second inflow channel resistance changing portion that changes a flow channel resistance of the second inflow channel; and an inflow channel-side common drive portion that applies drive forces for changing the flow channel resistances to both of the first inflow channel resistance changing portion and the second inflow channel resistance changing portion.

According to the liquid ejecting apparatus of the first aspect, the flow rates of the liquid in the first inflow channel and the second inflow channel can be controlled by the first inflow channel resistance changing portion and the second inflow channel resistance changing portion, respectively. The inflow channel-side common drive portion is common to the first inflow channel resistance changing portion and the second inflow channel resistance changing portion. Thus, the size of the liquid ejecting apparatus can be reduced and the distance between the nozzles can be reduced.

[2] In this case, the first inflow channel resistance changing portion may be formed as a deflectable inner wall surface of the first inflow channel. The second inflow channel resistance changing portion may be formed as a deflectable inner wall surface of the second inflow channel. The inflow channel-side common drive portion may cause the first inflow channel resistance changing portion and the second inflow channel resistance changing portion to respectively change the flow channel resistance of the first inflow channel and the flow channel resistance of the second inflow channel by applying external forces for deflecting the first inflow channel resistance changing portion and the second inflow channel resistance changing portion as the drive forces via a coupling member that abuts the first inflow channel resistance changing portion and the second inflow channel resistance changing portion.

In this case, the structure for controlling the flow rates of the liquid in the first inflow channel and the second inflow channel can be simplified.

[3] According to a second aspect of the invention, there is provided a liquid ejecting apparatus that ejects liquid from a plurality of nozzles including at least a first nozzle and a second nozzle. The liquid ejecting apparatus includes: a first liquid chamber that communicates with the first nozzle; a second liquid chamber that communicates with the second nozzle; a first volume changing portion that changes a volume of the first liquid chamber to eject the liquid from the first nozzle; a second volume changing portion that changes a volume of the second liquid chamber to eject the liquid from the second nozzle; a first inflow channel which is connected to the first liquid chamber and through which the liquid flows into the first liquid chamber; a second inflow channel which is connected to the second liquid chamber and through which the liquid flows into the second liquid chamber; a first outflow channel which is connected to the first liquid chamber and through which the liquid flows out of the first liquid chamber; a second outflow channel which is connected to the second liquid chamber and through which the liquid flows out of the second liquid chamber; a first outflow channel resistance changing portion that changes a flow channel resistance of the first outflow channel; a second outflow channel resistance changing portion that changes a flow channel resistance of the second outflow channel; and an outflow channel-side common drive portion that applies drive forces for changing the flow channel resistances to both of the first outflow channel resistance changing portion and the second outflow channel resistance changing portion.

According to the liquid ejecting apparatus of the second aspect, the flow rates of the liquid in the first outflow channel and the second outflow channel can be controlled by the first outflow channel resistance changing portion and the second outflow channel resistance changing portion, respectively.

The outflow channel-side common drive portion is common to the first outflow channel resistance changing portion and the second outflow channel resistance changing portion. Thus, the size of the liquid ejecting apparatus can be reduced and the distance between the nozzles can be reduced.

[4] In this case, the first outflow channel resistance changing portion may be formed as a deflectable inner wall surface of the first outflow channel. The second outflow channel resistance changing portion may be formed as a deflectable inner wall surface of the second outflow channel. The outflow channel-side common drive portion may cause the first outflow channel resistance changing portion and the second outflow channel resistance changing portion to respectively change the flow channel resistance of the first outflow channel and the flow channel resistance of the second outflow channel by applying external forces for deflecting the first outflow channel resistance changing portion and the second outflow channel resistance changing portion as the drive forces via an outflow channel-side coupling member that abuts the first outflow channel resistance changing portion and the second outflow channel resistance changing portion.

In this case, the structure for controlling the flow rates of the liquid in the first outflow channel and the second outflow channel can be simplified.

[5] In this case, the liquid ejecting apparatus may further include: a first inflow channel resistance changing portion that changes a flow channel resistance of the first inflow channel; a second inflow channel resistance changing portion that changes a flow channel resistance of the second inflow channel; and an inflow channel-side common drive portion that applies drive forces for changing the flow channel resistances to both of the first inflow channel resistance changing portion and the second inflow channel resistance changing portion.

In this case, the flow rates of the liquid in the first inflow channel and the second inflow channel can also be controlled in addition to the first outflow channel and the second outflow channel. The inflow channel-side common drive portion is common to the first inflow channel resistance changing portion and the second inflow channel resistance changing portion. Thus, the size of the liquid ejecting apparatus can be reduced and the distance between the nozzles can be reduced.

[6] In this case, the first inflow channel resistance changing portion may be formed as a deflectable inner wall surface of the first inflow channel. The second inflow channel resistance changing portion may be formed as a deflectable inner wall surface of the second inflow channel. The inflow channel-side common drive portion may cause the first inflow channel resistance changing portion and the second inflow channel resistance changing portion to respectively change the flow channel resistance of the first inflow channel and the flow channel resistance of the second inflow channel by applying external forces for deflecting the first inflow channel resistance changing portion and the second inflow channel resistance changing portion as the drive forces via an inflow channel-side coupling member that abuts the first inflow channel resistance changing portion and the second inflow channel resistance changing portion.

In this case, the structure for controlling the flow rates of the liquid in the first inflow channel and the second inflow channel can be simplified.

[7] According to a third aspect of the invention, there is provided a liquid ejecting apparatus that ejects liquid. The liquid ejecting apparatus includes: a liquid chamber that communicates with a nozzle; a volume changing portion that changes a volume of the liquid chamber to eject the liquid from the nozzle; an inflow channel which is connected to the liquid chamber and through which the liquid flows into the liquid chamber; an outflow channel which is connected to the liquid chamber and through which the liquid flows out of the liquid chamber; an inflow channel resistance changing portion that changes a flow channel resistance of the inflow channel; an outflow channel resistance changing portion that changes a flow channel resistance of the outflow channel; and a common drive portion that applies drive forces for changing the flow channel resistances to both of the inflow channel resistance changing portion and the outflow channel resistance changing portion.

According to the liquid ejecting apparatus of the third aspect, the flow rates of the liquid in the inflow channel and the outflow channel can be controlled by the inflow channel resistance changing portion and the outflow channel resistance changing portion, respectively. The common drive portion is common to the inflow channel resistance changing portion and the outflow channel resistance changing portion. Thus, the size of the liquid ejecting apparatus can be reduced.

[8] In this case, the liquid chamber may include a first liquid chamber that communicates with a first nozzle and a second liquid chamber that communicates with a second nozzle. The volume changing portion may include a first volume changing portion that changes a volume of the first liquid chamber and a second volume changing portion that changes a volume of the second liquid chamber. The inflow channel may include a first inflow channel connected to the first liquid chamber and a second inflow channel connected to the second liquid chamber. The outflow channel may include a first outflow channel connected to the first liquid chamber and a second outflow channel connected to the second liquid chamber. The inflow channel resistance changing portion may include a first inflow channel resistance changing portion that changes the flow channel resistance of the first inflow channel and a second inflow channel resistance changing portion that changes the flow channel resistance of the second inflow channel. The outflow channel resistance changing portion may include a first outflow channel resistance changing portion that changes the flow channel resistance of the first outflow channel and a second outflow channel resistance changing portion that changes the flow channel resistance of the second outflow channel. The common drive portion may apply the drive forces to the first inflow channel resistance changing portion, the second inflow channel resistance changing portion, the first outflow channel resistance changing portion, and the second outflow channel resistance changing portion.

In this case, the flow rates of the liquid in the outflow channels and the inflow channels connected to the plurality of liquid chambers can be controlled by the common drive portion. Thus, the size of the liquid ejecting apparatus can be reduced and the distance between the arrayed nozzles can be reduced.

[9] In this case, the inflow channel resistance changing portion may be formed as a deflectable inner wall surface of the inflow channel. The outflow channel resistance changing portion may be formed as a deflectable inner wall surface of the outflow channel. The common drive portion may cause the inflow channel resistance changing portion and the outflow channel resistance changing portion to respectively change the flow channel resistance of the inflow channel and the flow channel resistance of the outflow channel by applying external forces for deflecting the inflow channel resistance changing portion and the outflow channel resistance changing portion as the drive forces via a coupling member that couples the inflow channel resistance changing portion and the outflow channel resistance changing portion to each other.

In this case, the structure for controlling the flow rates of the liquid in the outflow channels and the inflow channels connected to the plurality of liquid chambers can be simplified.

All of the plurality of constituent elements provided in the aspects of the invention are not essential. A part of the plurality of constituent elements may be changed, omitted, or replaced with other new constituent elements and a part of the limitations may be omitted as appropriate in order to solve a part or all of the problems described above or attain a part or all of advantages described herein. Further, a part or all of the technical features included in one aspect of the invention may be combined with a part or all of the technical features included in another aspect of the invention and those technical features may be regarded as one independent aspect of the invention in order to solve a part or all of the problems described above or attain a part or all of the advantages described herein.

The invention may be implemented in various forms other than the liquid ejecting apparatus. For example, the invention may be implemented in the form of a liquid ejecting system, a head provided in a liquid ejecting apparatus, or a flow channel structure or a head structure of the liquid ejecting apparatus.

BRIEF DESCRIPTION OF THE DRAWINGS

The invention will be described with reference to the accompanying drawings, wherein like numbers reference like elements.

FIG. 13 is a second schematic view illustrating the structure of the head section according to the sixth embodiment.

DESCRIPTION OF EXEMPLARY EMBODIMENTS

A. First Embodiment

Figure 1:
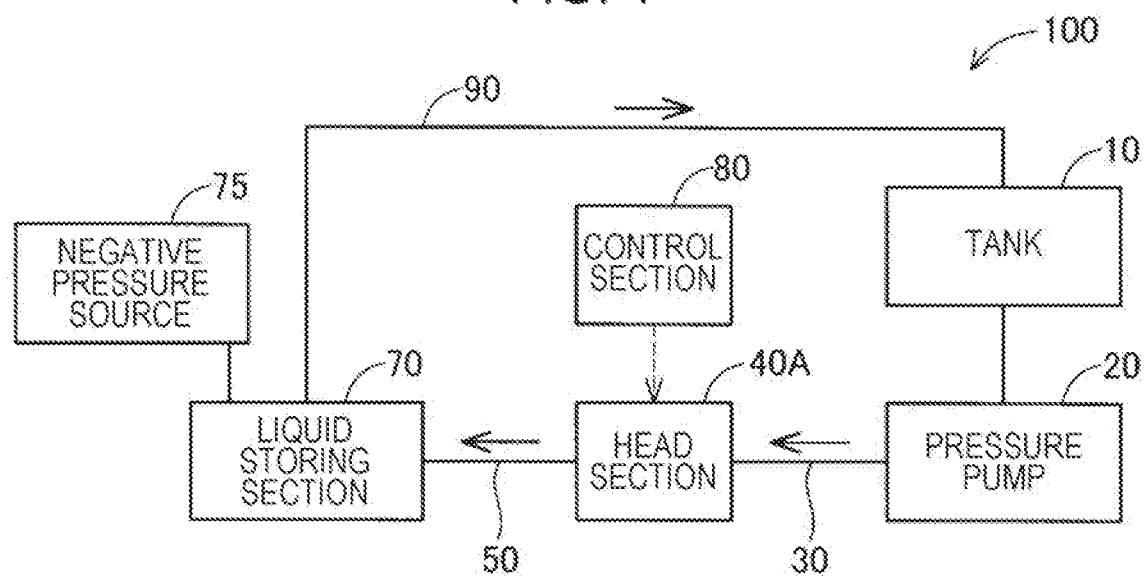
FIG. 1 is a schematic diagram illustrating the structure of a liquid ejecting apparatus according to a first embodiment.

FIG. 1 is a schematic diagram illustrating the structure of a liquid ejecting apparatus 100 according to a first embodiment. The liquid ejecting apparatus 100 includes a tank 10, a pressure pump 20, a supply channel 30, a head section 40A, a discharge channel 50, a liquid storing section 70, a negative pressure source 75, and a control section 80.

The tank 10 contains liquid. Examples of the liquid to be contained include ink having a predetermined viscosity. The liquid in the tank 10 is supplied to the head section 40A through the supply channel 30 by the pressure pump 20. The liquid supplied to the head section 40A is ejected by the head section 40A. An operation of the head section 40A is controlled by the control section 80. The structure of the head section 40A is described later.

The liquid which is not ejected by the head section 40A is discharged to the liquid storing section 70 through the discharge channel 50. The negative pressure source 75 that may be constituted by various types of pump is connected to the liquid storing section 70. The negative pressure source 75 generates a negative pressure in the liquid storing section 70, thereby sucking the liquid from the head section 40A through the discharge channel 50.

In this embodiment, the pressure pump 20 and the negative pressure source 75 function as a liquid supplying section that supplies the liquid to the head section 40A by generating a pressure difference between the supply channel and the discharge channel 50. The liquid supplying section may be constituted by the pressure pump 20 or the negative pressure source 75 alone while omitting one of the pressure pump 20 and the negative pressure source 75. As described above, in this embodiment, the liquid which is not ejected from the head section 40A is discharged from the head section 40A to the discharge channel 50, thereby being capable of suppressing accumulation of a precipitated component of the liquid in the head section 40A.

The liquid storing section 70 and the tank 10 are connected to each other by a circulation channel 90. The liquid stored in the liquid storing section 70 is returned to the tank 10 through the circulation channel 90 and is supplied to the head section 40A by the pressure pump 20 again. The circulation channel 90 may be provided with a pump that sucks the liquid from the liquid storing section 70. The circulation channel 90 may be omitted so that the liquid is not caused to circulate through the liquid ejecting apparatus 100.

The control section 80 is a computer including a CPU and a memory and executes a control program stored in the memory to implement various functions for controlling the liquid ejecting apparatus 100. The control program may be stored in various types of non-transient tangible recording medium.

Figure 2:
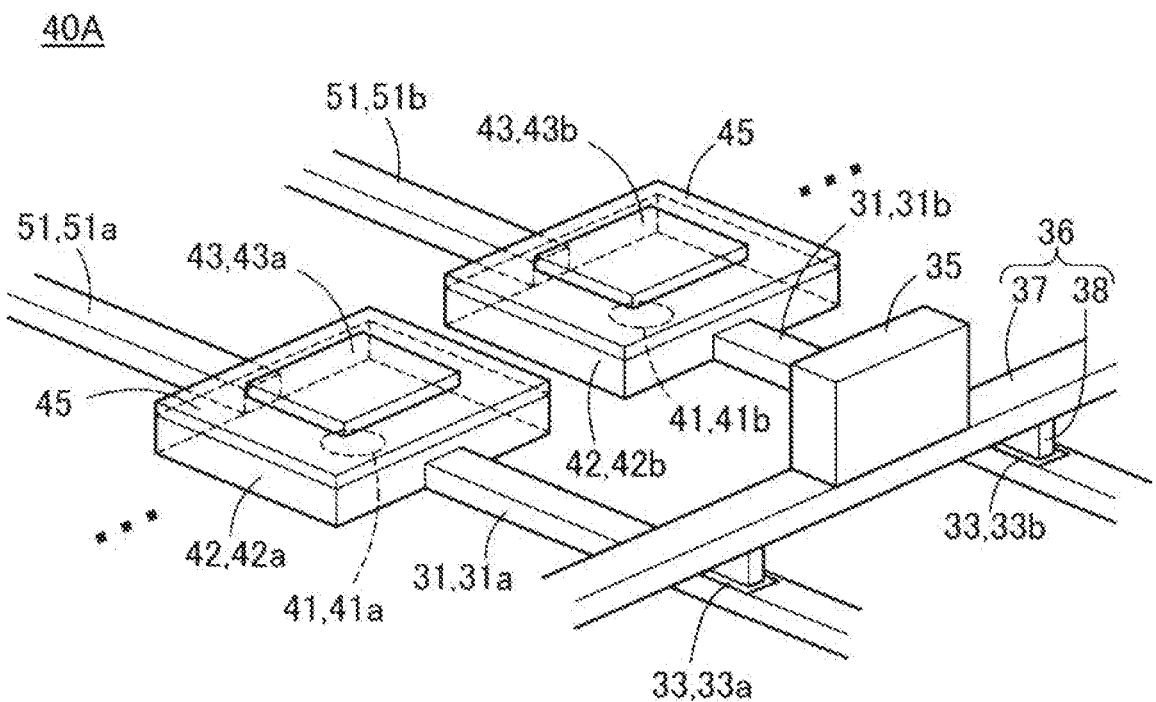
FIG. 2 is a schematic perspective view illustrating the internal structure of a head section according to the first embodiment.
Figure 3:
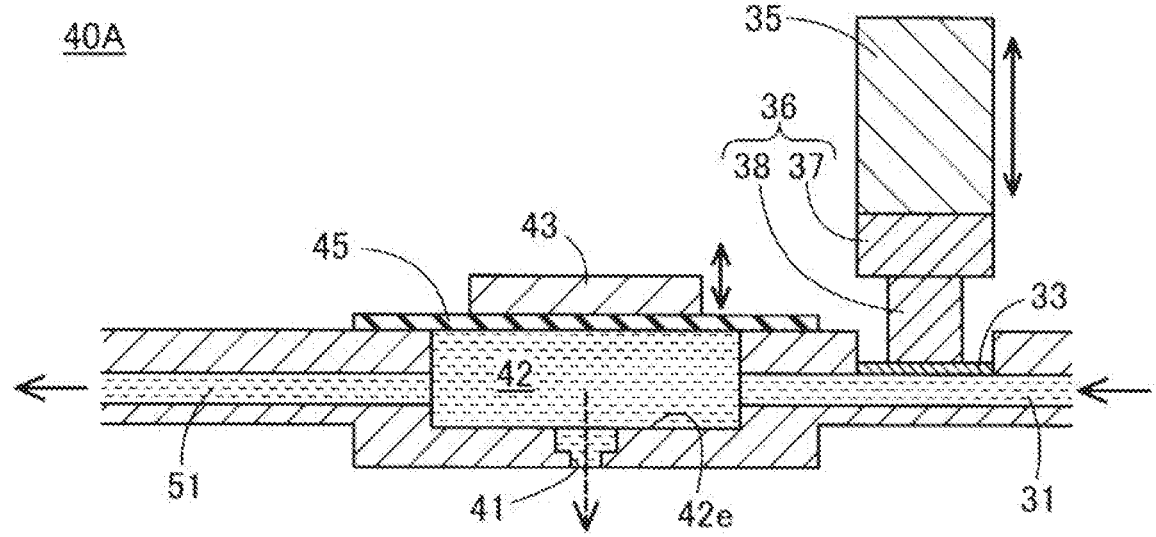
FIG. 3 is a schematic sectional view illustrating the structure of the head section according to the first embodiment.

The structure of the head section 40A according to the first embodiment is described with reference to FIG. 2 and FIG. 3. FIG. 2 is a schematic perspective view illustrating the internal structure of the head section 40A. FIG. 3 is a schematic sectional view of the head section 40A, which is taken along a cutting plane extending along a center axis of an arbitrary nozzle 41.

The head section 40A has a plurality of nozzles 41 that eject the liquid (FIG. 2). The plurality of nozzles 41 include at least a first nozzle 41a and a second nozzle 41b. The head section 40A has a plurality of liquid chambers 42 including at least a first liquid chamber 42a and a second liquid chamber 42b. Each liquid chamber 42 is a chamber to which the liquid is supplied. Each liquid chamber 42 is formed as a space inside a metal material. Each of the plurality of nozzles 41 communicates with a corresponding one of the plurality of liquid chambers 42. The first nozzle 41a communicates with the first liquid chamber 42a and the second nozzle 41b communicates with the second liquid chamber 42b. In this embodiment, each nozzle 41 is provided as a through hole that is open in a gravity direction through a bottom surface 42e of the liquid chamber (FIG. 3).

The head section 40A has a plurality of inflow channels 31 which are connected to the liquid chambers 42 one by one and through which the liquid flows into the liquid chambers 42 (FIG. 2). Each inflow channel 31 is a flow channel which branches from the supply channel 30 (FIG. 1). The plurality of inflow channels 31 include at least a first inflow channel 31a connected to the first liquid chamber 42a and a second inflow channel 31b connected to the second liquid chamber 42b. The respective inflow channels 31 have portions which extend parallel to each other toward the liquid chambers 42 to which the inflow channels 31 are connected.

The head section 40A further has a plurality of outflow channels 51 which are connected to the liquid chambers 42 one by one and through which the liquid flows out of the liquid chambers 42 (FIG. 2). Each outflow channel 51 joins the discharge channel 50 (FIG. 1). The plurality of outflow channels 51 include at least a first outflow channel 51a connected to the first liquid chamber 42a and a second outflow channel 51b connected to the second liquid chamber 42b. The respective outflow channels 51 have portions which extend parallel to each other from the liquid chambers 42 to which the outflow channels 51 are connected.

The head section 40A has a plurality of volume changing portions 43 (FIG. 2). The volume changing portions are provided on the liquid chambers 42 one by one and generate, under control of the control section 80 (FIG. 1), drive forces for ejecting the liquid from the nozzles 41 of the liquid chambers 42. The plurality of volume changing portions 43 include at least a first volume changing portion 43a provided on the first liquid chamber 42a and a second volume changing portion 43b provided on the second liquid chamber 42b.

A top surface 45 that is the upper surface of each liquid chamber 42 is formed as a diaphragm by a deflectable member such as a metal thin-film member or an elastic rubber (FIG. 3). The volume changing portion 43 is connected to an upper part of the top surface 45 and deflects the top surface 45 by applying a vertical external force to the top surface 45. Thus, the top surface 45 is shifted in the vertical direction to change the volume of the liquid chamber 42. In this embodiment, the volume changing portion 43 is formed of a piezoelectric actuator that is expansible/contractible in the vertical direction. In this embodiment, the volume changing portion 43 expands/contracts within a range of 5 to 15 μm. The expansion/contraction range of the volume changing portion 43 is not limited thereto but may be determined as appropriate depending on, for example, the shapes of the nozzle 41 and the liquid chamber 42 or the size of a liquid droplet to be ejected from the nozzle 41.

In this embodiment, the head section 40A has a plurality of inflow channel resistance changing portions 33 (FIG. 2). The inflow channel resistance changing portions 33 are portions capable of changing flow channel resistances of the inflow channels 31. The inflow channel resistance changing portions 33 are provided on the inflow channels 31 one by one. The plurality of inflow channel resistance changing portions 33 include at least a first inflow channel resistance changing portion 33a that changes a flow channel resistance of the first inflow channel 31a and a second inflow channel resistance changing portion 33b that changes a flow channel resistance of the second inflow channel 31b. In order to reduce the size of a coupling member 36, it is desirable that the inflow channel resistance changing portions 33 be provided at portions where the inflow channels 31 extend parallel to each other.

In the head section 40A, the inflow amount of the liquid to the liquid chamber 42 can be controlled by changing the flow channel resistance of each inflow channel by the inflow channel resistance changing portion 33. The inflow channel resistance changing portion 33 that functions as a flow control valve is provided at a position close to the liquid chamber 42, thereby increasing the controllability of the inflow amount of the liquid to the liquid chamber 42.

In this embodiment, the inflow channel resistance changing portion 33 is formed by arranging a deflectable member such as a metal thin film or an elastic rubber as a part of the inner wall surface of the inflow channel 31 (FIG. 3). In this embodiment, the inflow channel resistance changing portion 33 is arranged so as to be deflected in the vertical direction on the upper surface side of each inflow channel 31. When the inflow channel resistance changing portion 33 is deflected, the flow channel sectional area of the inflow channel 31 is changed at a portion which faces the inflow channel resistance changing portion 33, thereby changing the flow channel resistance of the inflow channel 31. In this embodiment, the inflow channel resistance changing portion 33 can disconnect the inflow channel 31 at a midpoint by being deflected until the inflow channel resistance changing portion 33 is brought into contact with the inner wall surface which faces the inflow channel resistance changing portion 33. It is only necessary that the inflow channel resistance changing portion 33 can increase/decrease the flow channel resistance of the inflow channel 31. The inflow channel resistance changing portion 33 need not be capable of disconnecting the inflow channel 31 completely.

The head section 40A of this embodiment includes an inflow channel-side common drive portion 35 (FIG. 2 and FIG. 3). Under control of the control section 80 (FIG. 1), the inflow channel-side common drive portion 35 applies drive forces for changing the flow channel resistances of the inflow channels 31 to the inflow channel resistance changing portions 33 including the first inflow channel resistance changing portion 33a and the second inflow channel resistance changing portion 33b. The drive forces generated by the inflow channel-side common drive portion 35 are applied to both of the first inflow channel resistance changing portion 33a and the second inflow channel resistance changing portion 33b at a time. In this embodiment, the inflow channel-side common drive portion 35 is formed of a piezoelectric actuator that is expansible/contractible in the vertical direction. The inflow channel-side common drive portion 35 expands/contracts in the vertical direction to apply external forces for deflecting the inflow channel resistance changing portions 33 as the drive forces described above.

In this embodiment, the inflow channel-side common drive portion 35 applies the external deflecting forces to the inflow channel resistance changing portions 33 via the coupling member 36 (FIG. 2 and FIG. 3). The coupling member includes a bridging portion 37 and a plurality of coupling portions 38. The bridging portion 37 is formed as a rod-shaped portion that bridges the inflow channel resistance changing portions 33. The plurality of coupling portions 38 are formed as protruding portions that protrude from the bridging portion 37 toward the inflow channel resistance changing portions 33 located on a lower side and are coupled to the inflow channel resistance changing portions 33 in abutment against the inflow channel resistance changing portions 33. The inflow channel-side common drive portion 35 vertically shifts the coupling member 36 through the expansive/contractive motion of the inflow channel-side common drive portion 35, thereby deflecting the inflow channel resistance changing portions 33.

The range in which the flow channel resistance can be changed is determined by an expansible/contractible length of the inflow channel-side common drive portion 35. Therefore, it is desirable that the range of the expansible/contractible length of the inflow channel-side common drive portion 35 be wider. In this embodiment, the expansible/contractible range of the inflow channel-side common drive portion 35 is at least wider than the expansible/contractible range of the volume changing portion 43. For example, the inflow channel-side common drive portion 35 expands/contracts within a range of 50 to 200 μm. Therefore, in this embodiment, the inflow channel-side common drive portion 35 has a larger size than the volume changing portion 43.

Description is made of an example of control to be performed by the control section 80 (FIG. 1) for the head section 40A. For example, the control section 80 controls the ejection of the liquid from each nozzle 41 of the head section 40A as follows. Before the ejection control is started, the control section 80 sets the volume of each liquid chamber 42 to a predetermined reference volume and the flow channel resistance of each inflow channel 31 to a predetermined reference resistance. The reference volume may be a volume of the liquid chamber 42 when a voltage for expansive/contractive motion is not applied to the volume changing portion 43. Similarly, the reference resistance may be a flow channel resistance of the inflow channel 31 when a voltage for expansive/contractive motion is not applied to the inflow channel-side common drive portion 35.

The control section 80 controls the pressure pump 20 and the negative pressure source 75 to control the inflow amount and the outflow amount of the liquid in the liquid chamber 42 so that the liquid does not leak from the nozzle 41, for example, the internal pressure of the liquid chamber becomes a pressure equal to or lower than a meniscus pressure of the nozzle 41. When a timing to eject the liquid has come, the control section 80 contracts the volume changing portion 43 to temporarily increase the volume of the liquid chamber 42, thereby filling the liquid chamber 42 with the liquid to be ejected.

At a timing when the pressure in the liquid chamber has sufficiently increased, the control section 80 sharply expands the volume changing portion 43 to reduce the volume of the liquid chamber 42, thereby increasing the pressure in the liquid chamber 42. Thus, the ejection of the liquid from the nozzle 41 is started. At this time, the control section 80 expands the inflow channel-side common drive portion 35 to increase the flow channel resistance of each inflow channel 31, thereby reducing the occurrence of a case in which the pressure in the liquid chamber 42 escapes toward the inflow channel 31.

The control section 80 contracts the volume changing portion 43 again to increase the volume of the liquid chamber 42, thereby reducing the pressure in the liquid chamber 42. Thus, a force for drawing the liquid back from the nozzle 41 to the liquid chamber 42 is generated and therefore the liquid ejected from the nozzle 41 can be separated as a liquid droplet. At this time, the control section 80 maintains the state in which the flow channel resistance of the inflow channel 31 has increased. Thus, it is possible to reduce the occurrence of a case in which the force for drawing the liquid back from the nozzle 41 to the liquid chamber 42 decreases due to the inflow of the liquid from the inflow channel 31 side.

When the ejection of the liquid droplet from the nozzle 41 is completed, the control section 80 resets the volume of the liquid chamber 42 to the reference volume and the flow channel resistance of the inflow channel 31 to the reference resistance. The control section 80 respectively controls the plurality of volume changing portions 43, thereby being capable of individually ejecting the liquid from the liquid chambers 42. In a case other than the case in which the liquid is ejected from the nozzle 41, the control section 80 may perform control for suppressing the inflow of the liquid into the liquid chamber 42 by increasing the flow channel resistance of the inflow channel 31 by the inflow channel resistance changing portion 33 in a state in which the driving of the negative pressure source 75 is stopped.

According to the liquid ejecting apparatus 100 of this embodiment, the flow rates of the liquid in the inflow channels 31 can be controlled by the inflow channel resistance changing portions 33. The inflow channel-side common drive portion 35 is common to the inflow channel resistance changing portions 33. Compared with a case in which dedicated drive portions (actuators) are provided for the respective inflow channel resistance changing portions 33, spaces for providing the drive portions can be saved. Thus, the sizes of the head section 40A and the liquid ejecting apparatus 100 including the head section 40A can be reduced. In the head section 40A having the plurality of nozzles 41, the nozzles 41 can be arrayed at a high density by reducing the distance between the nozzles 41. Further, the power consumption of the head section 40A can be reduced. According to the liquid ejecting apparatus 100 of this embodiment, the external forces generated by the inflow channel-side common drive portion 35 can be transmitted to the inflow channel resistance changing portions 33 by the simple structure via the coupling member 36. The control for synchronizing the operations of the inflow channel resistance changing portions 33 can be achieved easily. According to the liquid ejecting apparatus 100 of this embodiment, various other operations and advantages described in the embodiment can be attained.

B. Second Embodiment

Figure 4:
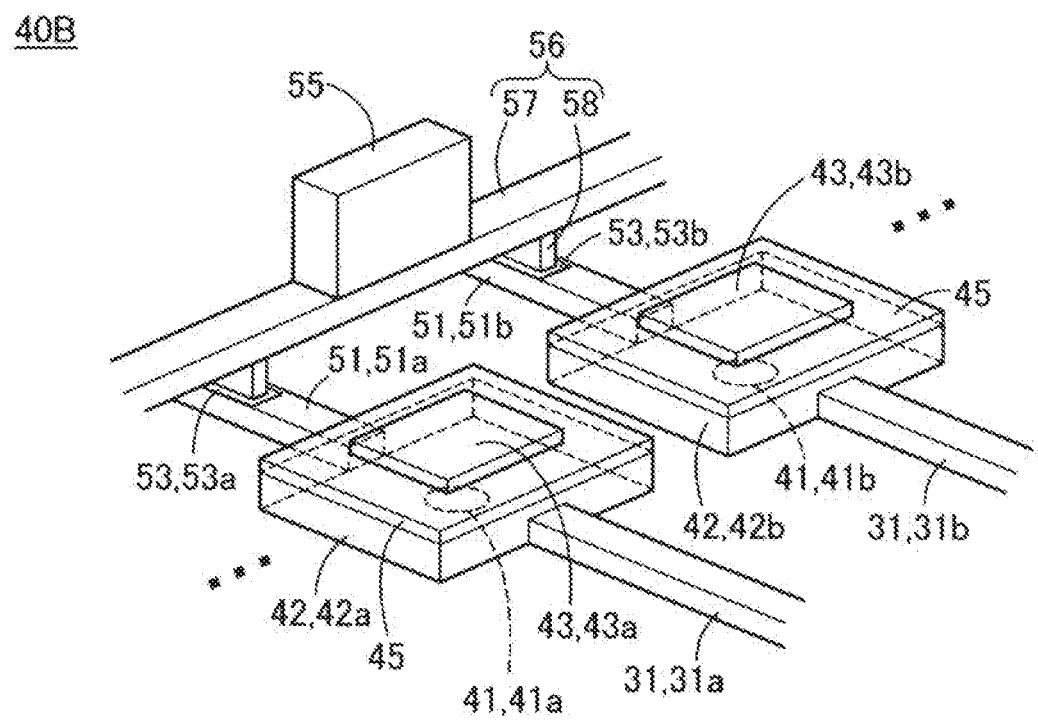
FIG. 4 is a schematic perspective view illustrating the internal structure of a head section according to a second embodiment.
Figure 5:
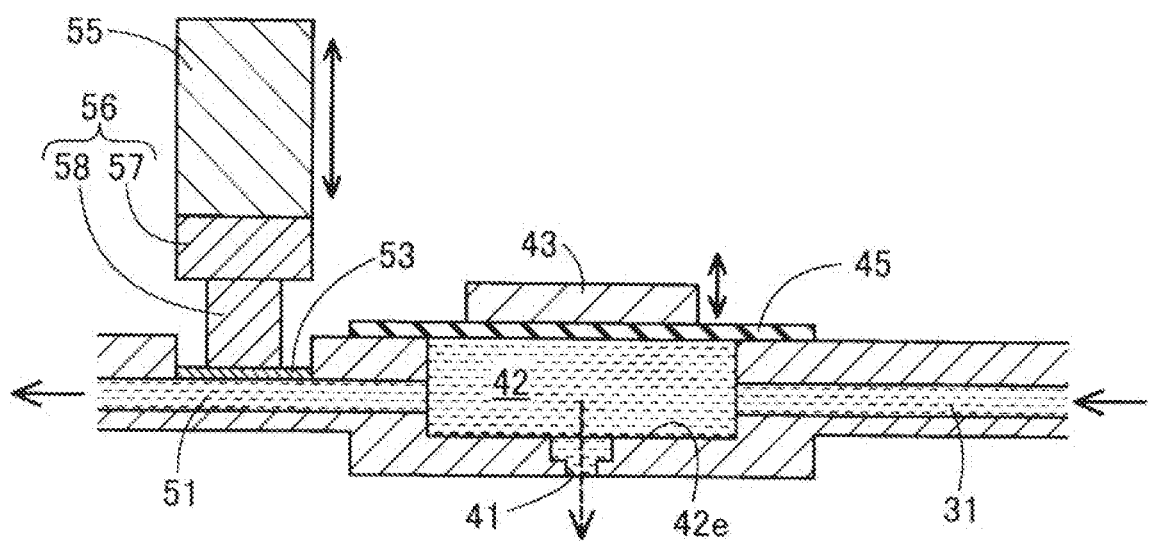
FIG. 5 is a schematic sectional view illustrating the structure of the head section according to the second embodiment.

The structure of a head section 40B provided in a liquid ejecting apparatus according to a second embodiment is described with reference to FIG. 4 and FIG. 5. FIG. 4 is a schematic perspective view illustrating the internal structure of the head section 40B. FIG. 5 is a schematic sectional view of the head section 40B, which is taken along a cutting plane extending along a center axis of an arbitrary nozzle 41.

The structure of the liquid ejecting apparatus of the second embodiment is substantially the same as that of the liquid ejecting apparatus 100 of the first embodiment (FIG. 1) except that the head section 40B is provided in place of the head section 40A. The structure of the head section 40B of the second embodiment is substantially the same as that of the head section 40A of the first embodiment (FIG. 2 and FIG. 3) except that a plurality of outflow channel resistance changing portions 53, an outflow channel-side common drive portion 55, and a coupling member 56 are provided in place of the plurality of inflow channel resistance changing portions 33, the inflow channel-side common drive portion 35, and the coupling member 36.

The plurality of outflow channel resistance changing portions 53 are portions capable of changing flow channel resistances of the outflow channels 51 (FIG. 4 and FIG. 5). The plurality of outflow channel resistance changing portions 53 are provided on the outflow channels 51 one by one. The plurality of outflow channel resistance changing portions 53 include at least a first outflow channel resistance changing portion 53a that changes a flow channel resistance of the first outflow channel 51a and a second outflow channel resistance changing portion 53b that changes a flow channel resistance of the second outflow channel 51b. In order to reduce the size of the coupling member 56, it is desirable that the outflow channel resistance changing portions 53 be provided at portions where the outflow channels 51 extend parallel to each other.

In the head section 40B, the outflow amount of the liquid from the liquid chamber 42 can be controlled by changing the flow channel resistance of each outflow channel 51 by the outflow channel resistance changing portion 53. The outflow channel resistance changing portion 53 that functions as a flow control valve is provided at a position close to the liquid chamber 42, thereby increasing the controllability of the outflow amount of the liquid from the liquid chamber 42.

Similarly to the inflow channel resistance changing portion 33 described in the first embodiment, the outflow channel resistance changing portion 53 is formed as a deflectable inner wall surface of the outflow channel 51 and is deflected in the vertical direction on the upper surface side of each outflow channel 51 (FIG. 5). When the outflow channel resistance changing portion 53 is deflected, the flow channel sectional area of the outflow channel 51 is changed at a portion which faces the outflow channel resistance changing portion 53, thereby changing the flow channel resistance of the outflow channel 51. The outflow channel resistance changing portion 53 can disconnect the outflow channel 51 at a midpoint by being deflected until the outflow channel resistance changing portion 53 is brought into contact with the inner wall surface which faces the outflow channel resistance changing portion 53. It is only necessary that the outflow channel resistance changing portion 53 can increase/decrease the flow channel resistance of the outflow channel 51. The outflow channel resistance changing portion 53 need not be capable of disconnecting the outflow channel 51 completely.

Under control of the control section 80 (FIG. 1), the outflow channel-side common drive portion 55 applies drive forces for changing the flow channel resistances of the outflow channels 51 to the outflow channel resistance changing portions 53 including the first outflow channel resistance changing portion 53a and the second outflow channel resistance changing portion 53b. The drive forces generated by the outflow channel-side common drive portion are applied to both of the first outflow channel resistance changing portion 53a and the second outflow channel resistance changing portion 53b at a time. The outflow channel-side common drive portion 55 is formed of a piezoelectric actuator that is expansible/contractible in the vertical direction. The outflow channel-side common drive portion 55 expands/contracts in the vertical direction to apply external forces for deflecting the outflow channel resistance changing portions 53 as the drive forces for changing the flow channel resistances of the outflow channels 51. The size and the range of the expansible/contractible length of the outflow channel-side common drive portion 55 are similar to those of the inflow channel-side common drive portion 35 described in the first embodiment.

The outflow channel-side common drive portion 55 applies the external deflecting forces to the outflow channel resistance changing portions 53 via the coupling member 56 (FIG. 4 and FIG. 5). The coupling member 56 includes a bridging portion 57 and a plurality of coupling portions 58. The bridging portion 57 is formed as a rod-shaped portion that bridges the outflow channel resistance changing portions 53. The plurality of coupling portions 58 are formed as protruding portions that protrude from the bridging portion 57 toward the outflow channel resistance changing portions 53 located on a lower side and are coupled to the outflow channel resistance changing portions 53 in abutment against the outflow channel resistance changing portions 53. The outflow channel-side common drive portion vertically shifts the coupling member 56 through the expansive/contractive motion of the outflow channel-side common drive portion 55, thereby deflecting the outflow channel resistance changing portions 53.

Description is made of an example of control to be performed by the control section 80 (FIG. 1) for the head section 40B in the liquid ejecting apparatus of the second embodiment. The control section 80 controls the ejection of the liquid from each nozzle 41 of the head section 40B similarly to the control described in the first embodiment except for the following points. When a timing to eject the liquid has come and the volume changing portion 43 is contracted in order to fill the liquid chamber 42 with the liquid, the control section 80 expands the outflow channel-side common drive portion 55 to increase the flow channel resistance of each outflow channel 51 from the predetermined initial reference resistance. Thus, the outflow of the fluid from each outflow channel 51 is suppressed and therefore the liquid chamber 42 is filled with the fluid promotionally.

Also when the volume changing portion 43 is expanded to start the ejection of the liquid from the nozzle 41, the control section 80 maintains the state in which the flow channel resistance of each outflow channel 51 has increased, thereby reducing the occurrence of a case in which the pressure in the liquid chamber 42 escapes toward the outflow channel 51. When the volume changing portion 43 is contracted to separate the liquid ejected from the nozzle 41 as a liquid droplet, the control section 80 contracts the outflow channel-side common drive portion 55 to reduce the flow channel resistance of the outflow channel 51. Thus, the pressure in the liquid chamber 42 is reduced promotionally, thereby being capable of increasing the force for drawing the liquid back from the nozzle 41 to the liquid chamber 42. In a case other than the case in which the liquid is ejected from the nozzle 41, the control section 80 may perform control for suppressing the outflow of the liquid from the liquid chamber 42 by increasing the flow channel resistance of the outflow channel 51 by the outflow channel resistance changing portion 53 in a state in which the driving of the pressure pump 20 is stopped.

According to the liquid ejecting apparatus including the head section 40B of the second embodiment, the flow rates of the liquid in the outflow channels 51 can be controlled by the outflow channel resistance changing portions 53. The outflow channel-side common drive portion 55 is common to the outflow channel resistance changing portions 53. Compared with a case in which dedicated drive portions are provided for the respective outflow channel resistance changing portions 53, spaces for providing the drive portions can be saved. Thus, the sizes of the head section 40B and the liquid ejecting apparatus including the head section 40B can be reduced. In the head section 40B having the plurality of nozzles 41, the nozzles 41 can be arrayed at a high density by reducing the distance between the nozzles 41. Further, the power consumption of the head section 40B can be reduced. According to the liquid ejecting apparatus of the second embodiment, the external forces generated by the outflow channel-side common drive portion 55 can be transmitted to the outflow channel resistance changing portions 53 by the simple structure via the coupling member 56. The control for synchronizing the operations of the outflow channel resistance changing portions 53 can be achieved easily. According to the liquid ejecting apparatus of the second embodiment, various other operations and advantages described in the first embodiment can be attained.

C. Third Embodiment

Figure 6:
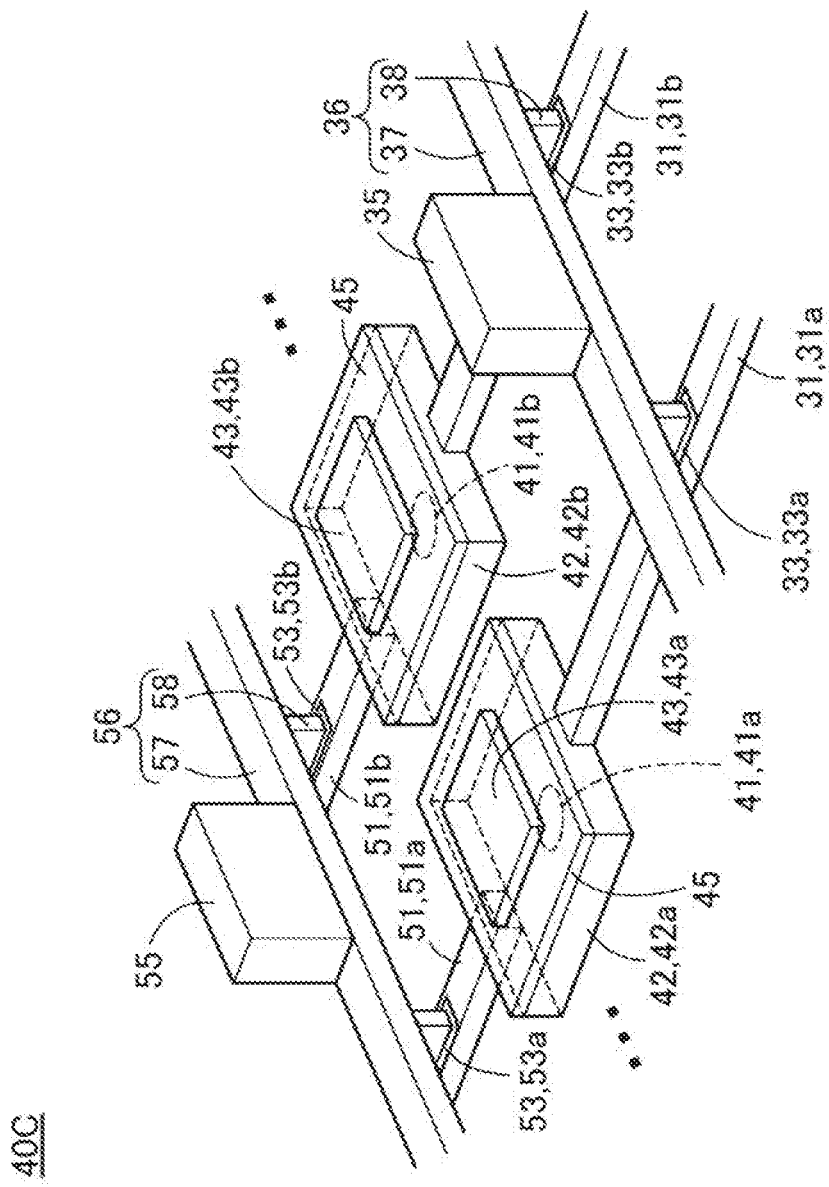
FIG. 6 is a schematic perspective view illustrating the internal structure of a head section according to a third embodiment.
Figure 7:
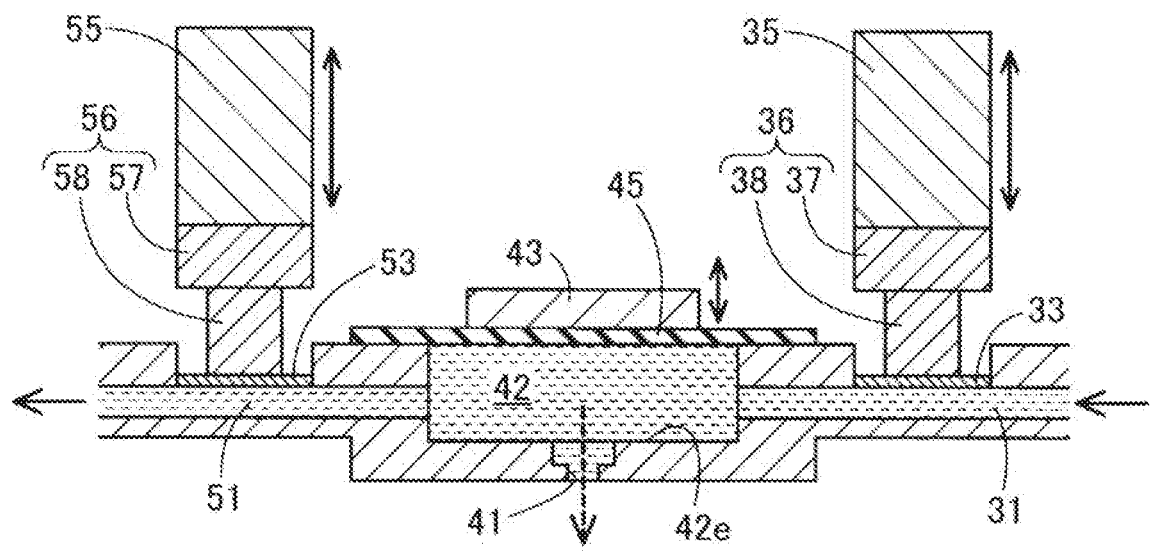
FIG. 7 is a schematic sectional view illustrating the structure of the head section according to the third embodiment.

The structure of a head section 40C provided in a liquid ejecting apparatus according to a third embodiment is described with reference to FIG. 6 and FIG. 7. FIG. 6 is a schematic perspective view illustrating the internal structure of the head section 40C. FIG. 7 is a schematic sectional view of the head section 40C, which is taken along a cutting plane extending along a center axis of an arbitrary nozzle 41.

The structure of the liquid ejecting apparatus of the third embodiment is substantially the same as that of the liquid ejecting apparatus 100 of the first embodiment (FIG. 1) except that the head section 40C is provided in place of the head section 40A. The structure of the head section 40C of the third embodiment is substantially the same as that of the head section 40B of the second embodiment (FIG. 4 and FIG. 5) except that the plurality of inflow channel resistance changing portions 33, the inflow channel-side common drive portion 35, and the coupling member 36 described in the first embodiment are added. In the third embodiment, the coupling member 36 on the inflow channel 31 side is also referred to as "inflow channel-side coupling member 36" and the coupling member 56 on the outflow channel 51 side is also referred to as "outflow channel-side coupling member 56" for convenience.

Description is made of an example of control to be performed by the control section 80 (FIG. 1) for the head section 40C in the liquid ejecting apparatus of the third embodiment. For example, the control section 80 may execute the control for the inflow channel-side common drive portion 35 described in the first embodiment in combination with the control for the outflow channel-side common drive portion 55 described in the second embodiment. Alternatively, in the liquid ejecting apparatus of the third embodiment, the control section 80 may execute the control for the inflow channel-side common drive portion 35 in synchronization with the control for the outflow channel-side common drive portion 55 similarly to a fourth embodiment described later. When the liquid is not ejected from the nozzles 41, the control section 80 may perform control for preventing leakage of the liquid from the nozzles 41 by expanding the inflow channel-side common drive portion 35 and the outflow channel-side common drive portion 55 to increase the flow channel resistances of the inflow channels 31 and the outflow channels 51.

According to the liquid ejecting apparatus including the head section 40C of the third embodiment, the flow rates of the liquid in the outflow channels 51 can be controlled by the outflow channel resistance changing portions 53 independently while the flow rates of the liquid in the inflow channels 31 are controlled by the inflow channel resistance changing portions 33. The inflow channel-side common drive portion 35 is common to the inflow channel resistance changing portions 33. Compared with a case in which drive portions are provided for the respective inflow channel resistance changing portions 33, spaces for providing the drive portions can be saved. Similarly, the outflow channel-side common drive portion 55 is common to the outflow channel resistance changing portions 53. Compared with a case in which drive portions are provided for the respective outflow channel resistance changing portions 53, spaces for providing the drive portions can be saved. Thus, the sizes of the head section 40C and the liquid ejecting apparatus including the head section 40C can be reduced. In the head section 40C having the plurality of nozzles 41, the nozzles 41 can be arrayed at a high density by reducing the distance between the nozzles 41. Further, the power consumption of the head section 40C can be reduced. According to the liquid ejecting apparatus of the third embodiment, the external forces can be transmitted from the inflow channel-side common drive portion 35 and the outflow channel-side common drive portion 55 to the inflow channel resistance changing portions 33 and the outflow channel resistance changing portions 53 by the simple structures via the inflow channel-side coupling member 36 and the outflow channel-side coupling member 56, respectively. The control for synchronizing the operations of the inflow channel resistance changing portions 33 and the control for synchronizing the operations of the outflow channel resistance changing portions 53 can be achieved easily by the simple structures. According to the liquid ejecting apparatus of the third embodiment, various other operations and advantages described in the first embodiment and the second embodiment can be attained.

D. Fourth Embodiment

Figure 8:
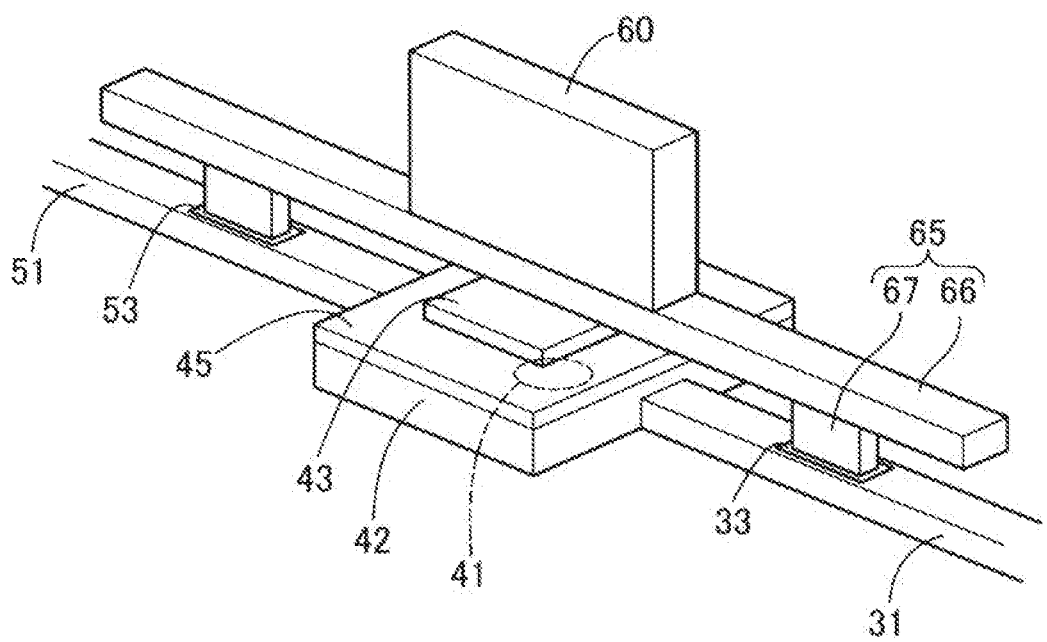
FIG. 8 is a schematic perspective view illustrating the internal structure of a head section according to a fourth embodiment.
Figure 9:
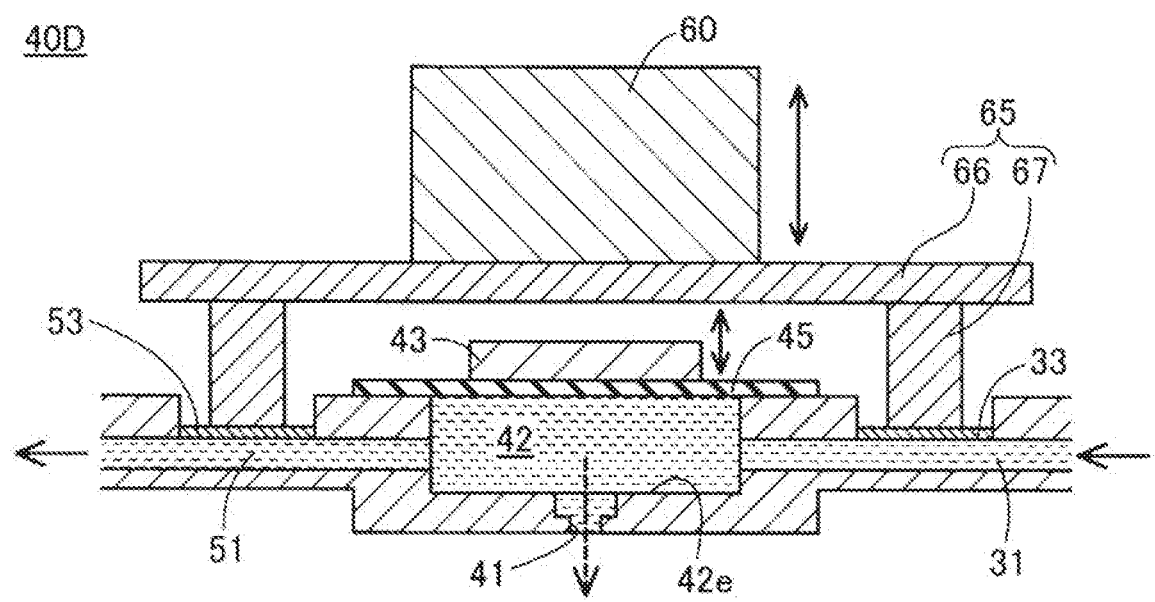
FIG. 9 is a schematic sectional view illustrating the structure of the head section according to the fourth embodiment.

The structure of a head section 40D provided in a liquid ejecting apparatus according to a fourth embodiment is described with reference to FIG. 8 and FIG. 9. FIG. 8 is a schematic perspective view illustrating the internal structure of the head section 40D. FIG. 9 is a schematic sectional view of the head section 40D, which is taken along a cutting plane extending along a center axis of an arbitrary nozzle 41.

The structure of the liquid ejecting apparatus of the fourth embodiment is substantially the same as that of the liquid ejecting apparatus 100 of the first embodiment (FIG. 1) except that the head section 40D is provided in place of the head section 40A. The structure of the head section 40D of the fourth embodiment is substantially the same as the structure of the head section 40C of the third embodiment (FIG. 6 and FIG. 7) except for the following points. The head section 40D of the fourth embodiment includes one nozzle 41, one liquid chamber 42, one inflow channel 31, one inflow channel resistance changing portion 33, one outflow channel 51, and one outflow channel resistance changing portion 53 (FIG. 8).

The head section 40D includes a common drive portion 60 in place of the inflow channel-side common drive portion 35 and the outflow channel-side common drive portion (FIG. 8 and FIG. 9). Under control of the control section 80 (FIG. 1), the common drive portion 60 applies a drive force for changing the flow channel resistance of the inflow channel 31 to the inflow channel resistance changing portion 33 and a drive force for changing the flow channel resistance of the outflow channel 51 to the outflow channel resistance changing portion 53. In this embodiment, the common drive portion 60 is formed of a piezoelectric actuator that is expansible/contractible in the vertical direction. The common drive portion 60 expands/contracts in the vertical direction to apply external forces for deflecting the inflow channel resistance changing portion 33 and the outflow channel resistance changing portion 53 as the drive forces described above.

The head section 40D includes a coupling member 65 in place of the inflow channel-side coupling member 36 and the outflow channel-side coupling member 56 (FIG. 8 and FIG. 9). In the head section 40D, the common drive portion 60 applies the external forces for deflecting the inflow channel resistance changing portion 33 and the outflow channel resistance changing portion 53 to the inflow channel resistance changing portion 33 and the outflow channel resistance changing portion 53 via the coupling member 65. The coupling member 65 includes a bridging portion 66 and two coupling portions 67. The bridging portion 66 is formed as a rod-shaped portion that bridges the inflow channel resistance changing portion 33 and the outflow channel resistance changing portion 53. The bridging portion 66 is arranged above the liquid chamber 42 and the volume changing portion 43 arranged on the upper part of the liquid chamber 42. Each coupling portion 67 is formed as a protruding portion that protrudes downward from the bridging portion 66. The lower end of the first coupling portion 67 is coupled to the inflow channel resistance changing portion 33 in abutment against the inflow channel resistance changing portion 33 and the lower end of the second coupling portion is coupled to the outflow channel resistance changing portion 53 in abutment against the outflow channel resistance changing portion 53. The common drive portion 60 vertically shifts the coupling member 65 through the expansive/contractive motion of the common drive portion 60, thereby deflecting the inflow channel resistance changing portion 33 and the outflow channel resistance changing portion 53. Thus, a change in the flow channel resistance of the inflow channel 31 and a change in the flow channel resistance of the outflow channel 51 can be synchronized with each other.

Figure 10:
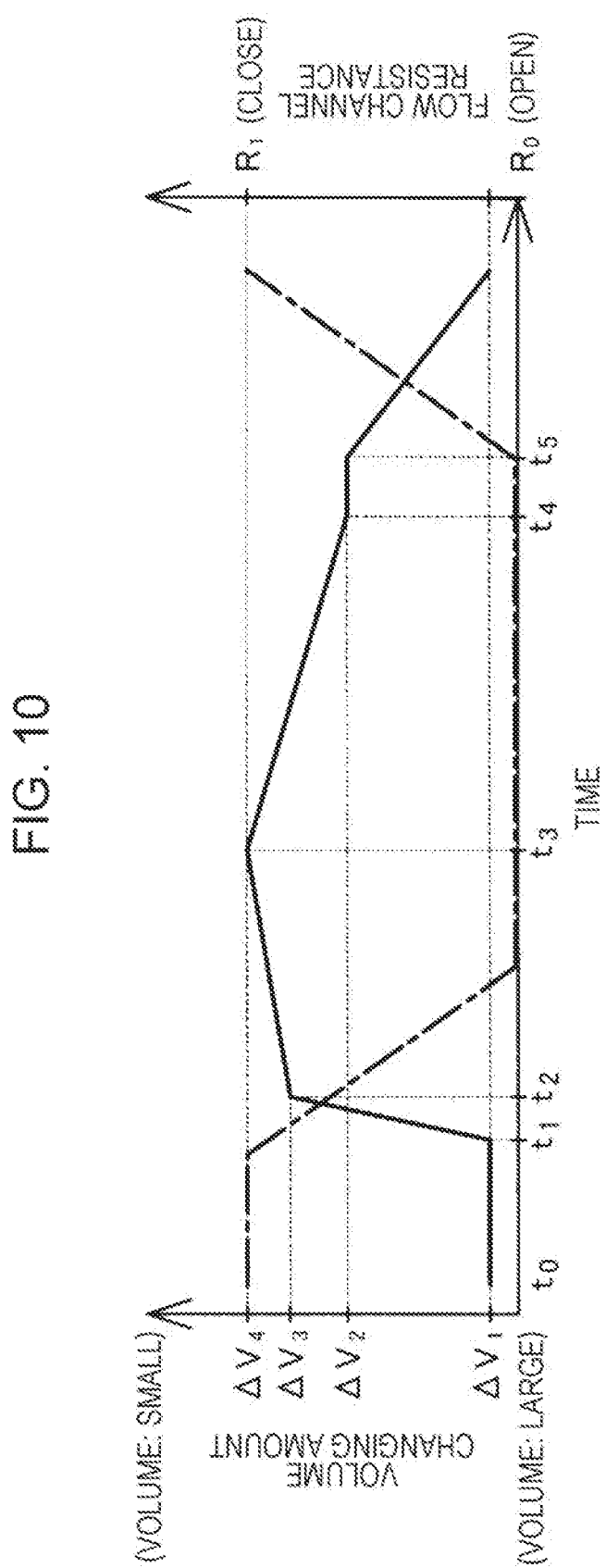
FIG. 10 is an explanatory diagram illustrating an example of a timing chart of ejection control according to the fourth embodiment.

An example of control to be performed by the control section 80 (FIG. 1) for the head section 40D in the liquid ejecting apparatus of the fourth embodiment is described with reference to FIG. 10. FIG. 10 is a timing chart illustrating ejection control to be executed by the control section 80 when the liquid is ejected from the nozzle 41. The horizontal axis of FIG. 10 represents an elapsed time. The vertical axis on the left side of the drawing sheet of FIG. 10 represents a volume changing amount that is an amount by which the volume of the liquid chamber is changed from the reference volume by the volume changing portion 43. As the value of the volume changing amount increases, the volume of the liquid chamber 42 decreases. Volume changing amounts $\Delta V_1$, $\Delta V_2$, $\Delta V_3$, and $\Delta V_4$ of FIG. 10 satisfy a relationship of $\Delta V_1 < \Delta V_2 < \Delta V_3 < \Delta V_4$. The vertical axis on the right side of the drawing sheet of FIG. 10 represents a flow channel resistance of each of the inflow channel 31 and the outflow channel 51. As the value of the flow channel resistance increases, the expansion amount of the common drive portion 60 increases and the flow channel sectional area decreases at each of the inflow channel resistance changing portion 33 and the outflow channel resistance changing portion 53. In FIG. 10, the solid line indicates a temporal change in the volume changing amount and the chain line indicates a temporal change in the flow channel opening degree.

At a time $t_0$ before the ejection of the liquid from the nozzle 41 is started, the control section 80 sets an initial state in which the volume of the liquid chamber 42 is slightly reduced by $\Delta V_1$ from the reference volume and the flow channel resistance is set to a maximum value $R_1$. When the flow channel resistance has the maximum value $R_1$, the expansion amount of the common drive portion 60 is maximum and therefore the inflow channel 31 and the outflow channel 51 are substantially closed. During a period between times $t_1$ and $t_2$, the control section 80 sharply expands the volume changing portion 43 to reduce the volume of the liquid chamber 42 by $\Delta V_3$ from the reference volume, thereby sharply increasing the pressure in the liquid chamber 42. This pressure is applied as a drive force to start the ejection of the liquid from the nozzle 41.

Before and after the time $t_1$, the control section starts to contract the common drive portion 60 to gradually reduce the flow channel resistance of each of the inflow channel 31 and the outflow channel 51. Thus, the flow channel resistance is set to a minimum value $R_0$ before a time $t_3$. From the time $t_2$ after the common drive portion 60 has started to contract, the control section 80 reduces the rate of expansion of the volume changing portion 43 to reduce the volume of the liquid chamber 42 more gently than during the period between the times $t_1$ and $t_2$. At the time $t_3$, the volume of the liquid chamber 42 is reduced by $\Delta V_4$ from the reference volume, thereby achieving a state in which the volume of the liquid chamber 42 is minimum.

During the period between the times $t_1$ and $t_2$, the flow channel resistance remains relatively high, thereby reducing the occurrence of a case in which the pressure in the liquid chamber 42 that is applied through the driving of the volume changing portion 43 for the ejection of the liquid escapes toward the inflow channel 31 or the outflow channel 51. During a period between the times $t_2$ and $t_3$, the flow channel resistance is set to the minimum value $R_0$ and therefore the inflow channel 31 and the outflow channel 51 are opened. Thus, the pressure in the liquid chamber 42 can be reduced sharply, thereby being capable of generating a suction force with which the liquid flowing out from the nozzle 41 is drawn back to the liquid chamber 42. With this force, the liquid flowing out from the nozzle 41 can be separated from the liquid in the nozzle 41 and therefore the liquid ejected from the nozzle 41 can be caused to fly as a liquid droplet. During the period between the times $t_2$ and $t_3$, the volume of the liquid chamber 42 is reduced gently for the purpose of suppressing entry of outside air from the nozzle 41 that may be caused by an excessive increase in the suction force generated by opening the inflow channel 31 and the outflow channel 51.

During a period between the time $t_3$ and a time $t_4$, the control section 80 increases the volume of the liquid chamber 42 to an intermediate volume that is reduced by $\Delta V_2$ from the reference volume. In this period, the control section 80 maintains the state in which the inflow channel and the outflow channel 51 are open with their flow channel resistances set to the minimum value $R_0$. Thus, the liquid circulates via the liquid chamber 42. At a time $t_5$ before the next ejection timing comes, the control section 80 starts to drive the volume changing portion 43 so as to increase the volume of the liquid chamber 42 and also starts to drive the common drive portion 60 so as to increase the flow channel resistance. Thus, the condition is reset to the initial state by the next ejection timing. In this stage, it is desirable that the rate of increase in the volume of the liquid chamber 42 be controlled so that the liquid does not leak from the nozzle 41 due to the liquid which is forced out of the inflow channel 31 and the outflow channel 51 into the liquid chamber 42 when the inflow channel 31 and the outflow channel 51 are closed.

In a case other than the case in which the liquid is ejected, the control section 80 may perform control for suppressing the inflow of the liquid into the liquid chamber 42 by closing the inflow channel 31 and the outflow channel 51 by the inflow channel resistance changing portion 33 and the outflow channel resistance changing portion 53, respectively. The control section 80 may perform control for actively circulating the liquid in the liquid chamber 42 by opening the inflow channel 31 and the outflow channel 51.

According to the liquid ejecting apparatus of the fourth embodiment, the flow rates of the liquid in the inflow channel 31 and the outflow channel 51 can be controlled by the inflow channel resistance changing portion 33 and the outflow channel resistance changing portion 53, respectively. The common drive portion 60 is common to the inflow channel resistance changing portion 33 and the outflow channel resistance changing portion 53. Compared with a case in which dedicated drive portions are provided for the inflow channel resistance changing portion 33 and the outflow channel resistance changing portion 53, spaces for providing the drive portions can be saved. Thus, the sizes of the head section 40D and the liquid ejecting apparatus including the head section 40D can be reduced. Further, the power consumption of the head section 40D can be reduced. According to the liquid ejecting apparatus of this embodiment, the external forces generated by the common drive portion 60 can be transmitted to the inflow channel resistance changing portion 33 and the outflow channel resistance changing portion 53 by the simple structure via the coupling member 65. The control for synchronizing the operation of the inflow channel resistance changing portion with the operation of the outflow channel resistance changing portion 53 can be achieved easily. According to the liquid ejecting apparatus of the fourth embodiment, various other operations and advantages described in the embodiments above can be attained.

E. Fifth Embodiment

Figure 11:
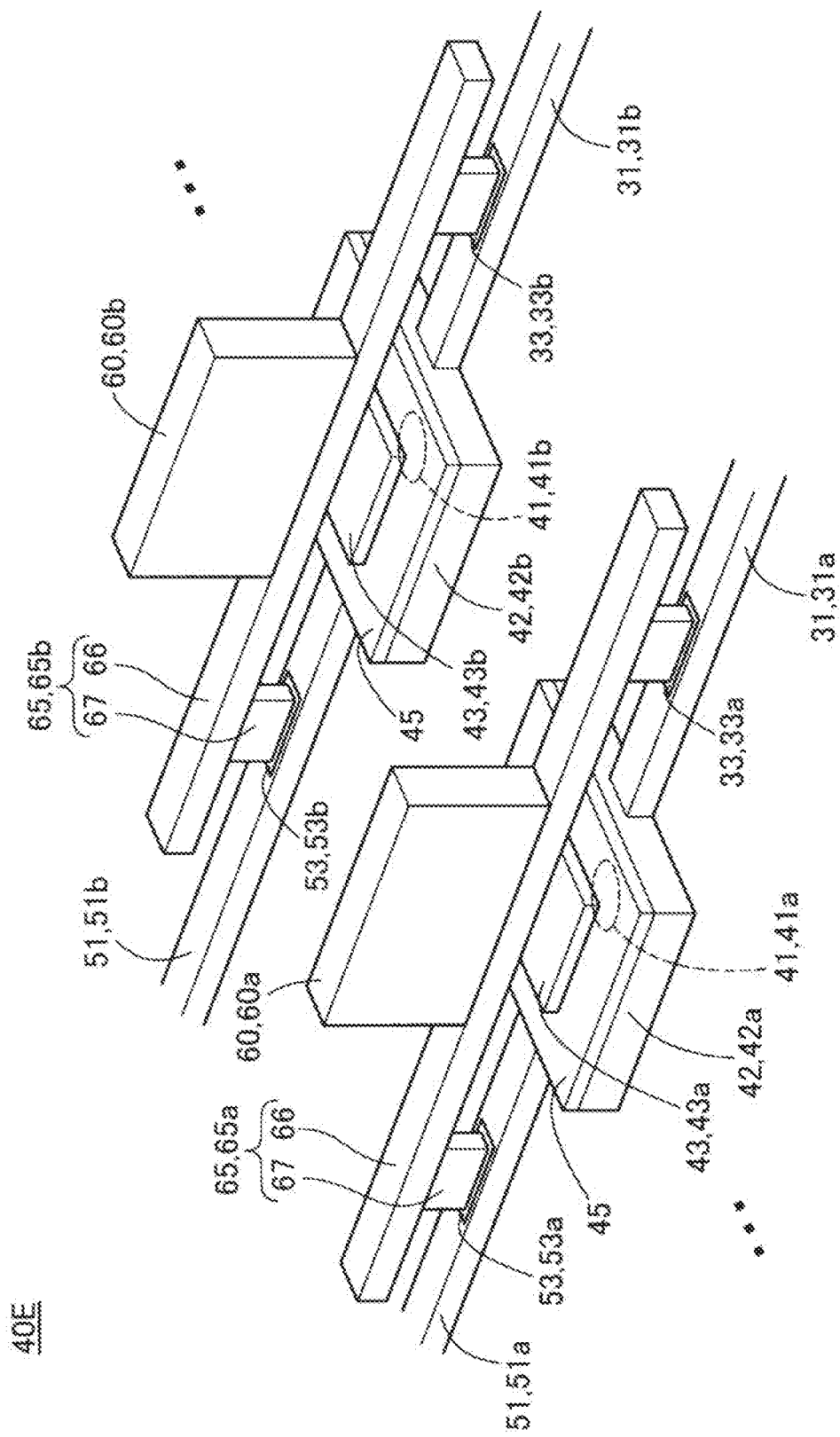
FIG. 11 is a schematic perspective view illustrating the internal structure of a head section according to a fifth embodiment.

FIG. 11 is a schematic perspective view illustrating the internal structure of a head section 40E provided in a liquid ejecting apparatus of a fifth embodiment. The structure of the liquid ejecting apparatus of the fifth embodiment is substantially the same as that of the liquid ejecting apparatus 100 of the first embodiment (FIG. 1) except that the head section 40E is provided in place of the head section 40A. The structure of the head section 40E of the fifth embodiment is substantially the same as that of the head section 40D of the fourth embodiment except for the following points.

The head section 40E includes a plurality of liquid chambers 42 each having the nozzle 41. In the head section 40E, the volume changing portion 43, the inflow channel 31 having the inflow channel resistance changing portion 33, the outflow channel 51 having the outflow channel resistance changing portion 53, the common drive portion 60, and the coupling member 65 are provided for each liquid chamber 42.

The plurality of nozzles 41 provided in the head section 40E include at least the first nozzle 41a and the second nozzle 41b. The plurality of liquid chambers 42 include at least the first liquid chamber 42a and the second liquid chamber 42b. The plurality of inflow channels 31 include at least the first inflow channel 31a connected to the first liquid chamber 42a and the second inflow channel 31b connected to the second liquid chamber 42b. The plurality of outflow channels 51 include at least the first outflow channel 51a connected to the first liquid chamber 42a and the second outflow channel 51b connected to the second liquid chamber 42b. The plurality of volume changing portions 43 include at least the first volume changing portion 43a and the second volume changing portion 43b.

The plurality of inflow channel resistance changing portions 33 provided in the head section 40E include at least the first inflow channel resistance changing portion 33a provided on the first inflow channel 31a and the second inflow channel resistance changing portion 33b provided on the second inflow channel 31b. The plurality of outflow channel resistance changing portions 53 provided in the head section 40E include at least the first outflow channel resistance changing portion 53a provided on the first outflow channel 51a and the second outflow channel resistance changing portion 53b provided on the second outflow channel 51b.

The plurality of common drive portions 60 provided in the head section 40E include at least a first common drive portion 60a provided for the first liquid chamber 42a and a second common drive portion 60b provided for the second liquid chamber 42b. The plurality of coupling members 65 provided in the head section 40E include a first coupling member 65a provided for the first liquid chamber 42a and a second coupling member 65b provided for the second liquid chamber 42b.

In the liquid ejecting apparatus of the fifth embodiment, the control section 80 (FIG. 1) controls the head section 40E similarly to the control described in the fourth embodiment. According to the head section 40E of the fifth embodiment, liquid droplets can be ejected from the plurality of nozzles 41. According to the liquid ejecting apparatus including the head section 40E of the fifth embodiment, various other operations and advantages described in the embodiments above can be attained.

F. Sixth Embodiment

Figure 12:
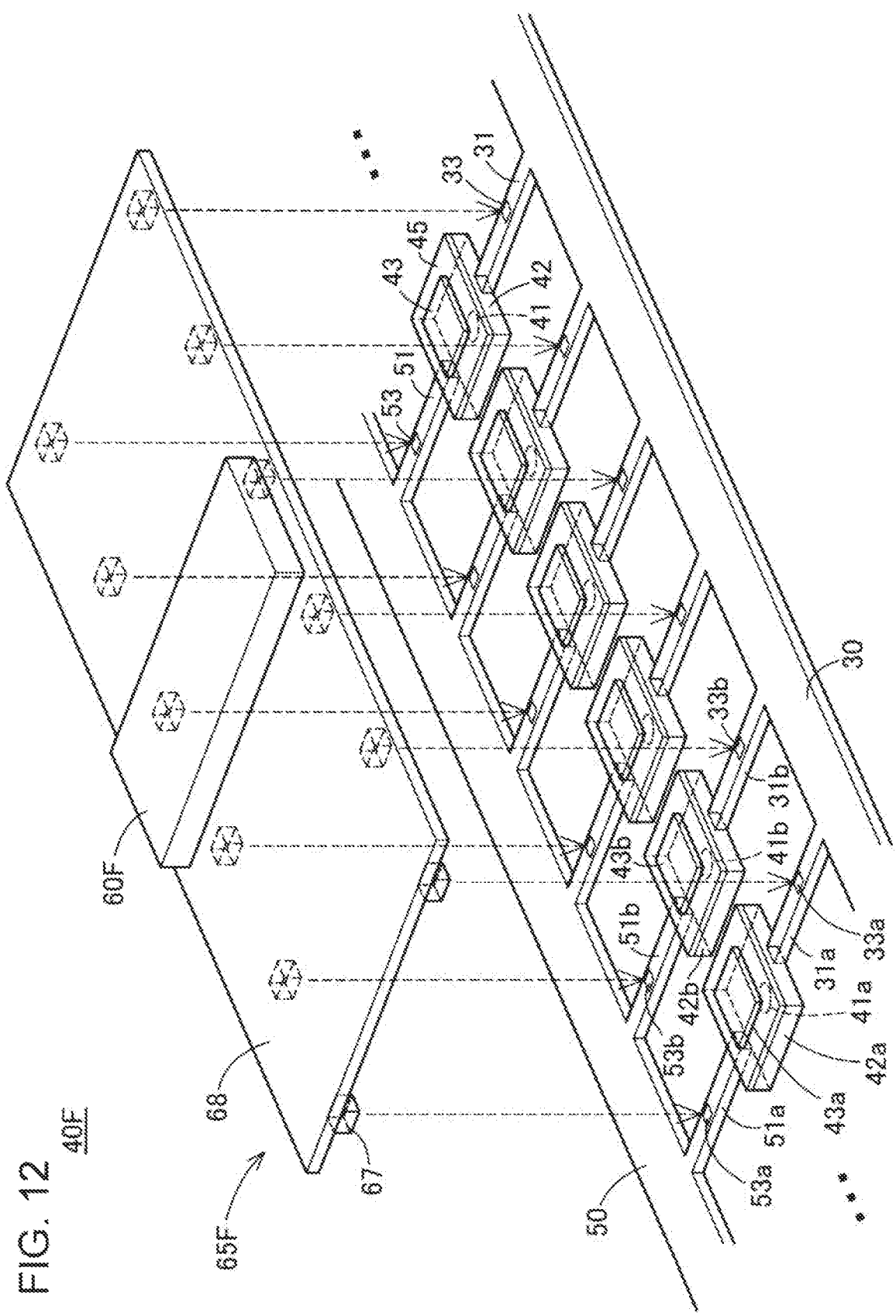
FIG. 12 is a first schematic view illustrating the structure of a head section according to a sixth embodiment.

The structure of a head section 40F provided in a liquid ejecting apparatus according to a sixth embodiment is described with reference to FIG. 12 and FIG. 13. FIG. 12 and FIG. 13 are schematic perspective views illustrating the internal structure of the head section 40F. FIG. 12 is an exploded view illustrating a state in which a coupling member 65F is separated for convenience. FIG. 13 illustrates a state of the head section 40F in use.

The structure of the liquid ejecting apparatus of the sixth embodiment is substantially the same as that of the liquid ejecting apparatus 100 of the first embodiment (FIG. 1) except that the head section 40F of the sixth embodiment is provided in place of the head section 40A. The structure of the head section 40F of the sixth embodiment is substantially the same as that of the head section 40E of the fifth embodiment (FIG. 11) except that a single common drive portion 60F is provided in place of the plurality of common drive portions 60 and the single coupling member 65F is provided in place of the plurality of coupling members 65.

The coupling member 65F of the sixth embodiment includes a coupling plate 68 provided with a plurality of coupling portions 67 (FIG. 12 and FIG. 13). The coupling plate 68 is a plate-shaped member that covers the inflow channel resistance changing portions 33 and the outflow channel resistance changing portions 53 provided for the respective liquid chambers 42. The coupling plate 68 is arranged above the liquid chambers 42 and the volume changing portions 43. The plurality of coupling portions 67 protrude downward from the lower surface of the coupling plate 68 and are coupled to the inflow channel resistance changing portions 33 and the outflow channel resistance changing portions 53 in abutment against the inflow channel resistance changing portions 33 and the outflow channel resistance changing portions 53.

The common drive portion 60F of the sixth embodiment is provided on the upper surface of the coupling plate 68. The common drive portion 60F vertically shifts the coupling member 65F through expansion/contraction, thereby deflecting the inflow channel resistance changing portions 33 and the outflow channel resistance changing portions 53.

In the liquid ejecting apparatus of the sixth embodiment, the control section 80 (FIG. 1) controls the head section 40F similarly to the control described in the fourth embodiment. According to the liquid ejecting apparatus of the sixth embodiment, the size of the head section 40F can be reduced compared with the head section 40E of the fifth embodiment that is provided with the common drive portion 60 for each of the plurality of liquid chambers 42. The driving operations for the plurality of inflow channel resistance changing portions 33 and the plurality of outflow channel resistance changing portions 53 can be synchronized easily by the single common drive portion 60F. According to the liquid ejecting apparatus of the sixth embodiment, various other operations and advantages described in the embodiments above can be attained.

G. Modified Examples

For example, the various structures described in the embodiments may be modified as follows. Modified examples described below are regarded as examples of embodiments of the invention similarly to the embodiments described above. In the following description, the "inflow channel-side common drive portion 35", the "outflow channel-side common drive portion 55", and the "common drive portions 60 and 60F" are collectively referred to simply as "common drive portion" when there is no particular need for distinction. Similarly, the "inflow channel-side coupling member 36", the "outflow channel-side coupling member 56", and the "coupling members 65 and 65F" are collectively referred to as "coupling member" when there is no particular need for distinction.

G1. Modified Example 1

In the embodiments, the inflow channel resistance changing portion 33 is formed as a deflectable inner wall surface of the inflow channel 31. The inflow channel resistance changing portion 33 may change the flow channel resistance of the inflow channel 31 by a different structure. For example, the inflow channel resistance changing portion 33 may be formed of a shutter wall portion to be shifted transversely in the inflow channel 31 to change the flow channel sectional area of the inflow channel 31. Alternatively, the inflow channel resistance changing portion 33 may be formed of a butterfly valve having a valve body that rotates inside the inflow channel 31.

G2. Modified Example 2

In the embodiments, the outflow channel resistance changing portion 53 is formed as a deflectable inner wall surface of the outflow channel 51. The outflow channel resistance changing portion 53 may change the flow channel resistance of the outflow channel 51 by a different structure. For example, the outflow channel resistance changing portion 53 may be formed of a shutter wall portion to be shifted transversely in the outflow channel 51 to change the flow channel sectional area of the outflow channel 51. Alternatively, the outflow channel resistance changing portion 53 may be formed of a butterfly valve having a valve body that rotates inside the outflow channel 51.

G3. Modified Example 3

In the embodiments, the common drive portion is formed of a piezoelectric actuator. The common drive portion may be formed of an actuator other than the piezoelectric actuator. For example, the common drive portion may be formed of any other actuator such as an air cylinder, a solenoid, or a magnetostrictive material. The common drive portion may be formed of a motor that applies a drive force in a distributed manner via gears to the shutter wall portions or the valve bodies of the butterfly valves described in Modified Example 1 and Modified Example 2.

G4. Modified Example 4

In the embodiments, the common drive portion applies the drive forces for changing the flow channel resistances to the inflow channel resistance changing portion 33 and the outflow channel resistance changing portion 53 via the coupling member. The common drive portion may apply the drive forces for changing the flow channel resistances to the inflow channel resistance changing portion 33 and the outflow channel resistance changing portion 53 by a structure other than the coupling member described in the embodiments. For example, when the common drive portion is formed of a motor as described in Modified Example 3, the common drive portion may apply a rotational drive force of the motor to the inflow channel resistance changing portion 33 and the outflow channel resistance changing portion 53 via gears.

G5. Modified Example 5

In the embodiments, the volume changing portion 43 is formed of a piezoelectric actuator. The volume changing portion 43 may be formed of an actuator other than the piezoelectric actuator. The volume changing portion 43 may be formed of any other actuator such as an air cylinder, a solenoid, or a magnetostrictive material.

G6. Modified Example 6

The control to be performed by the control section 80 for each of the head sections 40A to 40F as described in the embodiments is merely an example. The details of the control to be performed by the control section 80 are not limited to those of the control described in the embodiments.

G7. Modified Example 7

In the head section 40A of the first embodiment, the inflow channel resistance changing portions 33 are provided on the plurality of inflow channels 31, respectively, and the inflow channel-side common drive portion 35 drives the inflow channel resistance changing portions 33 in common. In the head section 40A, the plurality of inflow channels 31 may include an inflow channel 31 which is not provided with the inflow channel resistance changing portion 33 and the plurality of inflow channel resistance changing portions 33 may include an inflow channel resistance changing portion 33 to be driven by a drive portion other than the inflow channel-side common drive portion 35. Similarly in the head section 40B of the second embodiment, the plurality of outflow channels 51 may include an outflow channel 51 which is not provided with the outflow channel resistance changing portion 53 and the plurality of outflow channel resistance changing portions 53 may include an outflow channel resistance changing portion 53 to be driven by a drive portion other than the outflow channel-side common drive portion 55. Similarly in the head section 40C of the third embodiment, the plurality of inflow channels 31 may include an inflow channel 31 which is not provided with the inflow channel resistance changing portion 33 and the plurality of outflow channels 51 may include an outflow channel 51 which is not provided with the outflow channel resistance changing portion 53. Further, the plurality of inflow channel resistance changing portions 33 may include an inflow channel resistance changing portion 33 to be driven by a drive portion other than the inflow channel-side common drive portion 35 and the plurality of outflow channel resistance changing portions 53 may include an outflow channel resistance changing portion 53 to be driven by a drive portion other than the outflow channel-side common drive portion 55. Similarly in the head section 40E of the fifth embodiment, the plurality of inflow channels 31 and the plurality of outflow channels 51 may include an inflow channel 31 which is not provided with the inflow channel resistance changing portion 33 and an outflow channel 51 which is not provided with the outflow channel resistance changing portion 53. Further, the plurality of inflow channel resistance changing portions 33 and the plurality of outflow channel resistance changing portions 53 may include an inflow channel resistance changing portion 33 and an outflow channel resistance changing portion 53 to be driven by a drive portion other than the common drive portion 60. Similarly in the head section 40F of the sixth embodiment, the plurality of inflow channels 31 and the plurality of outflow channels 51 may include an inflow channel 31 which is not provided with the inflow channel resistance changing portion 33 and an outflow channel 51 which is not provided with the outflow channel resistance changing portion 53. Further, the plurality of sets of the inflow channel resistance changing portion 33 and the outflow channel resistance changing portion 53 may include a set of the inflow channel resistance changing portion 33 and the outflow channel resistance changing portion 53 to be driven by a drive portion other than the common drive portion 60F.

G8. Modified Example 8

The invention is not limited to the liquid ejecting apparatus that ejects ink but is also applicable to arbitrary liquid ejecting apparatuses that eject liquid other than ink. For example, the invention is applicable to various liquid ejecting apparatuses described below.

(1) Image recording apparatus such as a facsimile machine
(2) Color material ejecting apparatus to be used for manufacturing color filters for image display apparatuses such as a liquid crystal display
(3) Electrode material ejecting apparatus to be used for forming electrodes of organic electro-luminescence (EL) displays, field emission displays (FEDs), or the like
(4) Liquid ejecting apparatus that ejects liquid containing bioorganic compounds to be used for manufacturing bio-chips
(5) Specimen ejecting apparatus serving as a precision pipette
(6) Lubricating oil ejecting apparatus
(7) Liquid resin ejecting apparatus
(8) Liquid ejecting apparatus that ejects lubricating oil to precision instruments such as a watch, a clock, or a camera with pinpoint accuracy
(9) Liquid ejecting apparatus that ejects a transparent liquid resin such as an ultraviolet curable liquid resin onto substrates so as to form, for example, hemispherical microlenses (optical lenses) to be used for optical communication devices or the like
(10) Liquid ejecting apparatus that ejects an acidic or alkaline etchant for etching of substrates or the like
(11) Liquid ejecting apparatus including a liquid ejecting head that ejects a trace of other arbitrary liquid droplets

G9. Modified Example 9

In the embodiments, a part or all of the functions and processing implemented by software may be implemented by hardware. Further, a part or all of the functions and processing implemented by hardware may be implemented by software. Examples of hardware to be used may include an integrated circuit, a discrete circuit, a circuit module obtained by combining those circuits, and various other circuits.

The invention is not limited to the embodiments, the examples, and the modified examples described above but may be implemented by various structures without departing from the spirit of the invention. For example, the technical features of the embodiments, the examples, and the modified examples corresponding to the technical features of the aspects described in Summary may be replaced or combined as appropriate in order to solve a part or all of the problems described above or attain a part or all of the advantages described above. Further, the technical features are not limited to those described as being inessential herein but may be omitted as appropriate unless the technical features are described as being essential herein.

The "liquid droplet" herein refers to a state of liquid to be ejected from the liquid ejecting apparatus and includes liquid in the form of a particle, a teardrop, and a streak. The "liquid" as used herein is only required to be a material which may be consumed by the liquid ejecting apparatus. For example, the "liquid" is only required to be a material corresponding to a substance in a liquid phase and includes liquid materials having a high or low viscosity, sol, gel, and other liquid materials such as inorganic solvents, organic solvents, solutions, liquid resins, and liquid metals (molten metals). Further, the "liquid" includes not only liquid that is one state of a substance but also liquid in a state in which particles of a functional material composed of a solid such as pigments or metal particles are dissolved, dispersed, or mixed in a solvent. The liquid is typified by ink and liquid crystal. The ink encompasses various liquid compositions such as general water-based or oil-based ink, gel ink, and hot-melt ink.

The entire disclosure of Japanese Patent Application No. 2017-062698, filed Mar. 28, 2017 is expressly incorporated by reference herein.

What is claimed is:

1. A liquid ejecting apparatus comprising:
    first and second nozzles from which a liquid is ejected;
    a first liquid chamber configured to store the liquid and fluidly communicating with the first nozzle;
    a second liquid chamber configured to store the liquid and fluidly communicating with the second nozzle;
    a first volume changing actuator configured to change a volume of the first liquid chamber so as to eject the liquid from the first nozzle, the first volume changing actuator being disposed over the first liquid chamber so that the first volume changing actuator and the first liquid chamber are overlapped with each other in a plan view;
    a second volume changing actuator configured to change a volume of the second liquid chamber so as to eject the liquid from the second nozzle, the second volume changing actuator being disposed over the second liquid chamber so that the second volume changing actuator and the second liquid chamber are overlapped with each other in the plan view;
    a first inflow channel which is connected to the first liquid chamber and through which the liquid flows into the first liquid chamber;
    a second inflow channel which is connected to the second liquid chamber and through which the liquid flows into the second liquid chamber;
    a first outflow channel which is connected to the first liquid chamber and through which the liquid flows out of the first liquid chamber;
    a second outflow channel which is connected to the second liquid chamber and through which the liquid flows out of the second liquid chamber;
    a first outflow channel resistance changing plate configured to change a flow channel resistance of the first outflow channel, the first outflow channel resistance changing plate being disposed on the first outflow channel so that the first outflow channel resistance changing plate and the first outflow channel are overlapped with each other in the plan view;
    a second outflow channel resistance changing plate configured to change a flow channel resistance of the second outflow channel, the second outflow channel resistance changing plate being disposed over the second outflow channel so that the second outflow channel resistance changing plate and the second outflow channel are overlapped with each other in the plan view; and
    an outflow channel-side common drive actuator configured to commonly apply drive forces to the first and second outflow channel resistance changing plates so as to change the flow channel resistances of the first and second outflow channels, the outflow channel-side common drive actuator being disposed on the first and second outflow channel resistance changing plates via a linkage; and
    a controller configured to:
        control an expansion amount of the first volume changing actuator so as to control the volume of the first liquid chamber;
        control an expansion amount of the outflow channel-side common drive actuator so as to control the flow channel resistances of the first and second outflow channels,
    wherein the drive forces are transmitted to the first and second outflow channel resistance changing plates via the linkage by downwardly pushing the first and second outflow channel resistance changing plates.

2. The liquid ejecting apparatus according to claim 1,
    wherein the linkage is configured with a bridging member and first and second coupling members,
    the bridging member is connected to the outflow channel-side common drive actuator so as to receive the drive forces from the outflow channel-side common drive actuator, and
    the first and second coupling members extend from the bridging member and are connected to the first and second outflow channel resistance changing plates, drive actuator via the bridging member.

3. The liquid ejecting apparatus according to claim 1, further comprising:
    a first inflow channel resistance changing portion that changes a flow channel resistance of the first inflow channel;
    a second inflow channel resistance changing portion that changes a flow channel resistance of the second inflow channel; and
    an inflow channel-side common drive portion that applies drive forces for changing the flow channel resistances to both of the first inflow channel resistance changing portion and the second inflow channel resistance changing portion.

4. The liquid ejecting apparatus according to claim 3,
    wherein the first inflow channel resistance changing portion is formed as a deflectable inner wall surface of the first inflow channel,
    wherein the second inflow channel resistance changing portion is formed as a deflectable inner wall surface of the second inflow channel, and
    wherein the inflow channel-side common drive portion causes the first inflow channel resistance changing portion and the second inflow channel resistance changing portion to respectively change the flow channel resistance of the first inflow channel and the flow channel resistance of the second inflow channel by applying external forces for deflecting the first inflow channel resistance changing portion and the second inflow channel resistance changing portion as the drive forces via an inflow channel-side coupling member that abuts the first inflow channel resistance changing portion and the second inflow channel resistance changing portion.

* * * * *